(12) United States Patent
Park (10) Patent No.: US 6,218,210 B1
(45) Date of Patent: Apr. 17, 2001

(54) METHOD FOR FABRICATING IMAGE SENSOR WITH EXTENDED PINNED PHOTODIODE

(75) Inventor: Sang Hoon Park, Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/342,968

(22) Filed: Jun. 29, 1999

(30) Foreign Application Priority Data

Jun. 29, 1998 (KR) .................................. 98-24650
Jun. 29, 1998 (KR) .................................. 98-24712

(51) Int. Cl.$^7$ .................................................. H01L 21/00
(52) U.S. Cl. ............................................. 438/57; 438/60
(58) Field of Search ......................... 438/57, 60, 197, 438/199, 210, 237, 75; 257/292, 293, 290, 291, 210

(56) References Cited

U.S. PATENT DOCUMENTS

| 4,984,047 | 1/1991 | Stevens | 357/30 |
|---|---|---|---|
| 5,051,797 | 9/1991 | Erhardt | 357/24 |
| 5,841,159 | 11/1998 | Lee et al. | 257/291 |
| 6,023,081 | * 2/2000 | Dowley et al. | 257/292 |
| 6,026,964 | * 2/2000 | Hook et al. | 257/292 |
| 6,027,955 | * 2/2000 | Lee et al. | 438/57 |
| 6,043,115 | * 3/2000 | Pan | 438/199 |

* cited by examiner

*Primary Examiner*—David Nelms
*Assistant Examiner*—Dung Ans Le
(74) *Attorney, Agent, or Firm*—Townsend and Townsend and Crew LLP (57) ABSTRACT

The present invention is to provide a method for fabricating a CMOS image sensor, including, the steps of providing a semiconductor layer of a first conductive type; exposing a portion of the semiconductor layer, thereby defining a light sensing area in which a photodiode is formed; growing an epitaxial layer on the exposed semiconductor layer; implanting impurities of a second conductive type into the grown epitaxial layer, thereby forming a second type diffusion layer; implanting impurities of the first conductive type into the grown epitaxial layer so that a first type diffusion layer is formed in the second type diffusion layer, wherein a thickness of the first conductive diffusion layer formed is thinner than that of the second type conductive diffusion layer; and patterning the grown epitaxial layer.

16 Claims, 9 Drawing Sheets

METHOD FOR FABRICATING IMAGE SENSOR WITH EXTENDED PINNED PHOTODIODE

FIELD OF THE INVENTION

The present invention relates to an image sensor; and, more particularly, to a method for fabricating a CMOS (Complementary Metal Oxide Semiconductor) image sensor with an extended pinned photodiode.

1. Description of the Prior Art

Generally, a CMOS image sensor is an apparatus to convert an optical image into electrical signals and employs MOS (Metal Oxide Semiconductor) transistors. A CCD (Charge Coupled Device) image sensor, as a kind of image sensor, has been widely known. As compared with the CCD image sensor, the CMOS image sensor may be easily driven with the various scanning schemes and integrated with a signal processing circuit on one-chip. Therefore, the CMOS image sensor may miniaturize its size and reduce the fabricating cost by using a compatible CMOS technology and lower the power consumption.

Figure 1:
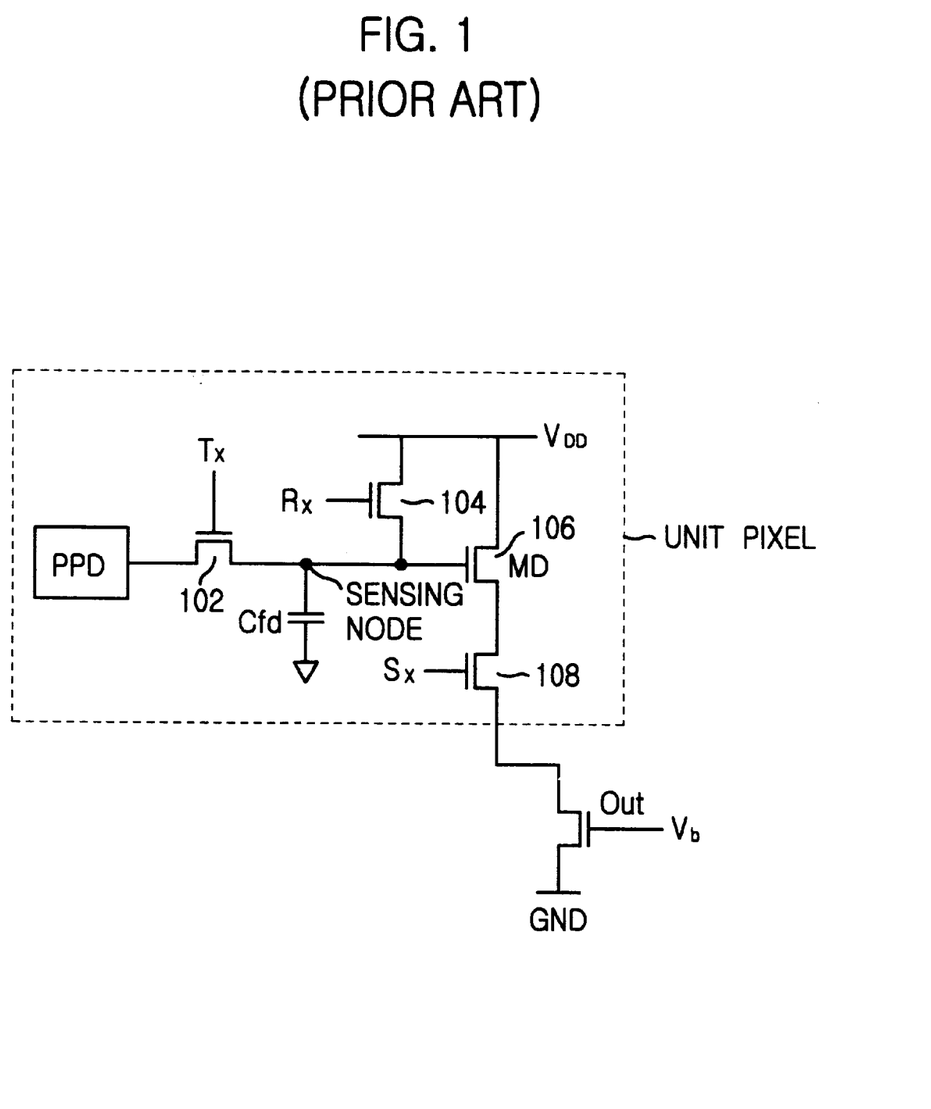
FIG. 1 is a circuit diagram illustrating a unit pixel of a conventional CMOS image sensor.

Referring to FIG. 1, a conventional unit pixel of a CMOS image sensor is composed of a pinned photodiode (PPD) and four NMOS transistors. The four NMOS transistors include a transfer transistor 102 for transferring photoelectric charges generated in a pinned photodiode to a sensing node, a reset transistor 104 for resetting the sensing node in order to sense a next signal, a drive transistor 106 for acting as a source follower and a select transistor 108 for outputting data to an output terminal in response to an address signal.

The reset transistor 104 and the transfer transistor 102 are made up of a native NMOS transistor so that the charge transfer efficiency is improved. The native NMOS transistor having a negative threshold voltage can prevent electron losses from being generated by a voltage drop due to a positive threshold voltage and then contribute the charge transfer efficiency to be improved.

Figure 2:
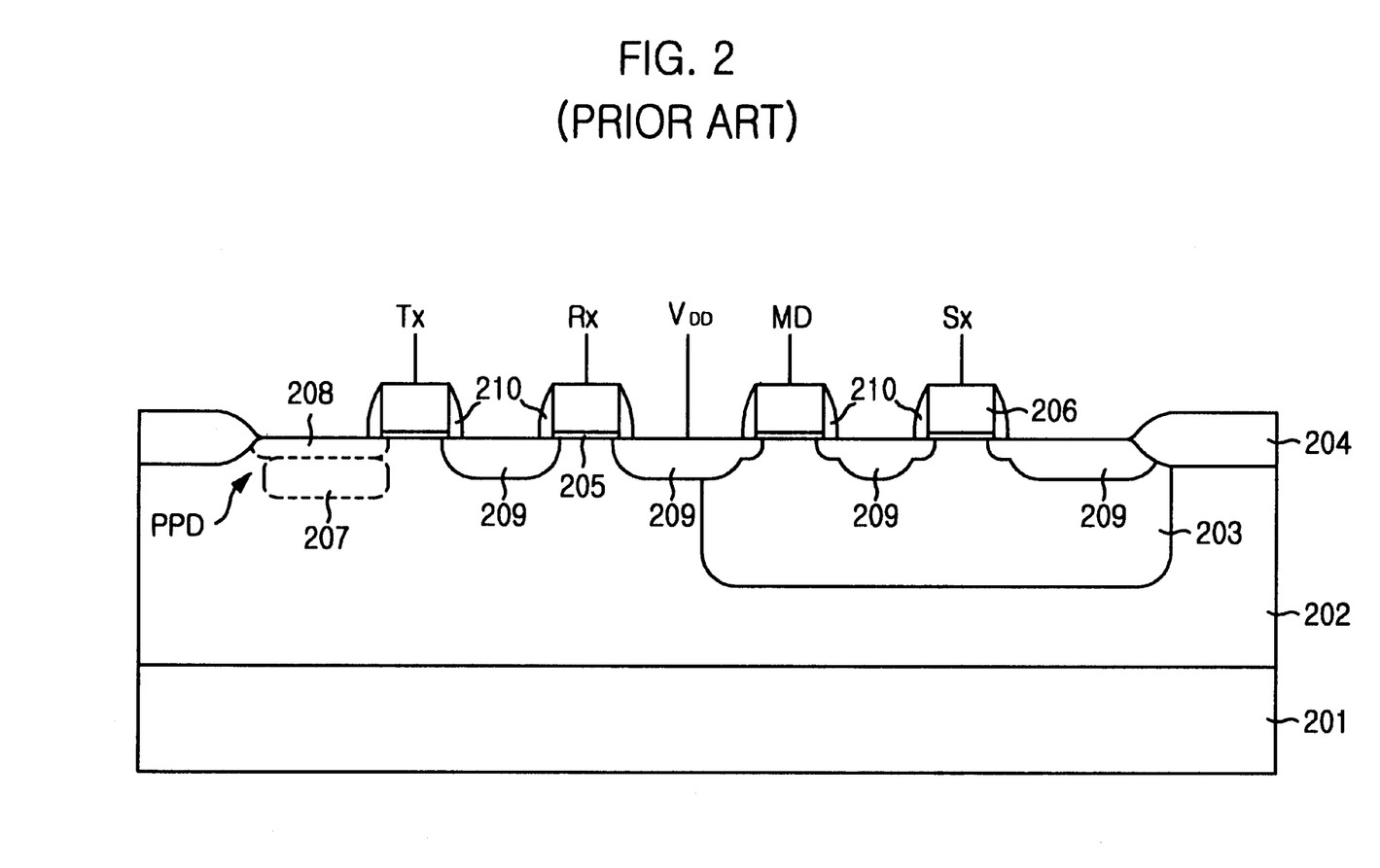
FIG. 2 is a cross-sectional view illustrating a structure of the unit pixel in FIG. 1.

Referring to FIG. 2, the conventional unit pixel of the CMOS image sensor includes a P$^+$ silicon substrate 201, a P-epi (epitaxial) layer 202, a P-well region 203, field oxide layers 204, a gate oxide layer 205, gate electrodes 206, an N$^-$ diffusion region 207, a P$^0$ diffusion region 208, an N$^+$ diffusion region 209 and oxide layer spacers 210. A pinned photodiode (PPD) has a PNP junction structure in which the P-epi 202, the N$^-$ diffusion region 207 and the P$^0$ diffusion region 208 are stacked. Such a pinned photodiode includes two p-type regions, each of which has the same potential so that the N$^-$ diffusion region 207 is fully depleted at a pinning voltage.

Since the transfer transistor having the transfer gate Tx is made up of a native transistor, an ion implantation process for adjusting transistor characteristics (threshold voltage and punch-through characteristics) may be omitted in the p-epi layer 202 which acts as a channel beneath a transfer gate Tx. Accordingly, the NMOS transistor (native transistor) having a negative threshold voltage may maximize the charge transfer efficiency. The N$^+$ diffusion region 209 (the sensing node) is made up of a heavily doped N$^+$ region between the transfer gate Tx and the reset gate Rx, thereby amplifying a potential of the sensing node according to an amount of transferred charges.

Since a doping concentration of the P-epi layer 202 is lower than that of the P$^+$ silicon substrate 201, the p-epi layer 202 may increase a photosensitivity by increasing the depletion depth of the pinned photodiode. Also, the heavily doped P$^+$ silicon substrate 201 beneath the P-epi layer 202 improves the sensor array modulation transfer function by reducing the random diffusion of the photoelectric charges. The random diffusion of charges in the P$^+$silicon substrate 201 leads to the possible "miscollection" of the photoelectric charges by neighboring pixels and directly results in a loss of image sharpness or a lower modulation transfer function. The shorter minority carrier lifetime and higher doping concentration of the P$^+$ silicon substrate 201 significantly reduces the "miscollection" of photoelectric charges since the charges are quickly recombined before diffusing to the neighboring pixels.

Since the pinned photodiode is formed on a predetermined region of the P-epi layer 202 between the field oxide layer 204 and the transfer gate Tx, it is impossible that the pinned photodiode may increase its unit area without reducing an integration degree. Also, the pinned photodiode may not increase its unit area beyond a design rule. When the design rule of the CMOS image sensor is less than 0.25 $\mu$m, the photosensitivity and resolution of the CMOS image sensor is reduced.

SUMMARY OF THE INVENTION

It is, therefore, an object of the present invention to provide a method for fabricating an image sensor that may increase a unit area of a pinned photodiode with maintaining a constant integration degree, thereby increasing a photosensitivity.

In accordance with an aspect of the present invention, there is provided a method for fabricating a CMOS image sensor, comprising, the steps of (a) providing a semiconductor layer of a first conductive type; (b) exposing a portion of the semiconductor layer, thereby defining a light sensing area in which a photodiode is formed; (c) growing an epitaxial layer on the exposed semiconductor layer; (d) implanting impurities of a second conductive type into the grown epitaxial layer, thereby forming a second type diffusion layer; (e) implanting impurities of the first conductive type into the grown epitaxial layer so that a first type diffusion layer is formed in the second type diffusion layer, wherein a thickness of the first conductive diffusion layer formed is thinner than that of the second type conductive diffusion layer; and (f) patterning the grown epitaxial layer, whereby a surface area of the patterned epitaxial layer is wider than that of the exposed semiconductor layer and a PN junction is formed along a surface of the patterned epitaxial layer.

In accordance with another aspect of the present invention, there is provided a method for fabricating a CMOS image sensor, comprising, the steps of (a) providing a semiconductor layer of a first conductive type; (b) exposing a portion of the semiconductor layer, thereby defining a light sensing area in which a photodiode is formed; (c) growing an epitaxial layer on the exposed semiconductor layer; (d) implanting impurities of a second conductive type into the grown epitaxial layer, thereby forming a second type diffusion layer; (e) patterning the grown epitaxial layer; (f) forming an ion implanting mask exposing the grown epitaxial layer; and (g) implanting impurities of the first conductive type into the grown epitaxial layer so that a first type diffusion layer is formed in the second type diffusion layer, wherein a thickness of the first conductive diffusion layer formed is thinner than that of the second type conductive diffusion layer and wherein the first type diffusion layer is directly in contact with the semiconductor layer, whereby a surface area of the patterned epitaxial layer is wider than that of the exposed semiconductor layer and a PN junction is formed along a surface of the patterned epitaxial layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereafter, the present invention will be described in detail with reference to the accompanying drawings.

As shown in FIGS. 3A to 3H, a unit pixel of a CMOS image sensor according to an embodiment of the present invention has a cylindrical pinned photodiode to increase a unit area of a pinned photodiode with a predetermined integration degree, thereby increasing a photosensitivity.

Figure 3A:
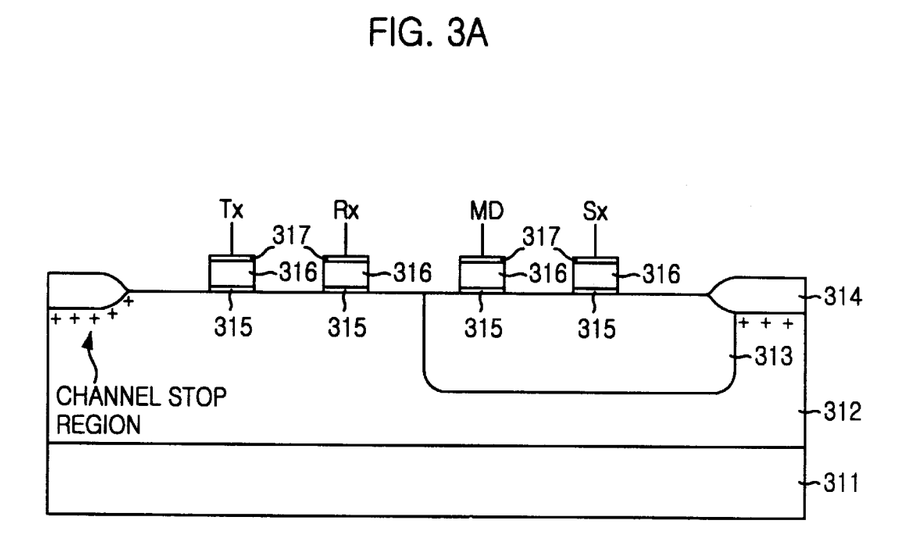
FIGS. 3A to 3H are cross-sectional views illustrating a method for fabricating a unit pixel according to an embodiment of the present invention.

Referring to FIG. 3A, on conditions of energy of approximately 50–100 KeV and a concentration of 7E12–9E12/$cm^2$, a P-well 313 is formed in a P-epi layer 312 using a boron ion implantation and the P-epi layer 312 is grown on a silicon substrate 311 as an epitaxial layer. The P-epi layer 312 has a resistance of approximately 10–100 Ωm. After forming field oxide layers 314, channel stop regions are formed beneath the field oxide layers 314. Gate oxide layers 315, gate electrodes 316 and mask oxide layers 317 are in this order formed. At this time, the gate electrodes 316 are positioned between the gate oxide layer 315 and the mask oxide layer 317 and made up of a polysilicon layer. Also, a refractory metal silicide layer may be formed on the gate electrodes 316, and such a polycide structure is typically composed of the polysilicon layer and the refractory metal silicide. Tungsten, titanium, tantalum and molybdic silicides and so on are available to the refractory metal silicide. Transfer and reset gates Tx and Rx have channel length more than approximately 1 μm. Also, drive and select gates MD and Sx have channel length less than approximately 0.5 μm.

Figure 3B:
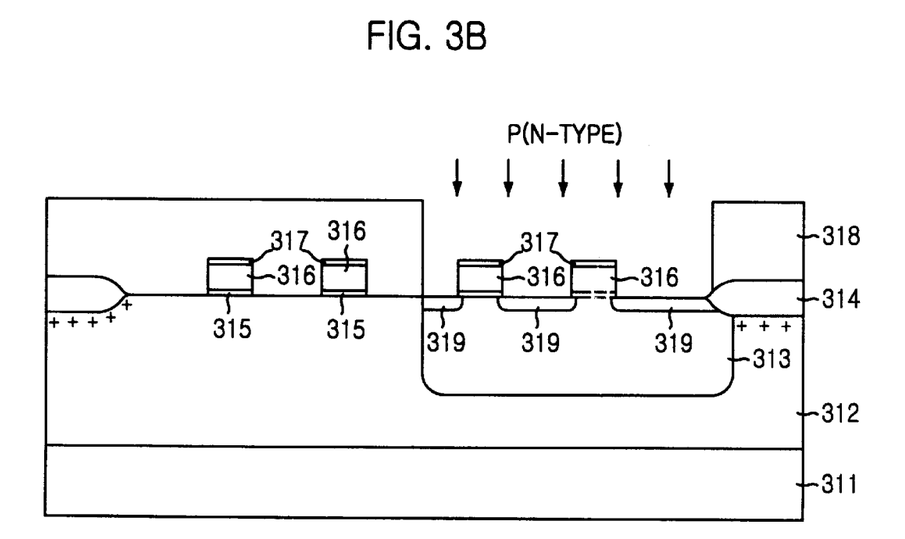

Referring to FIG. 3B, a first mask pattern 318 to open the P-well 313 is formed. Then, on conditions of energy of approximately 20–60 KeV and a concentration of 1E13–5E13/$cm^2$, lightly doped N$^-$ regions 319 for a LDD (lightly doped drain) structure are formed by a phosphor ion implantation.

Figure 3C:
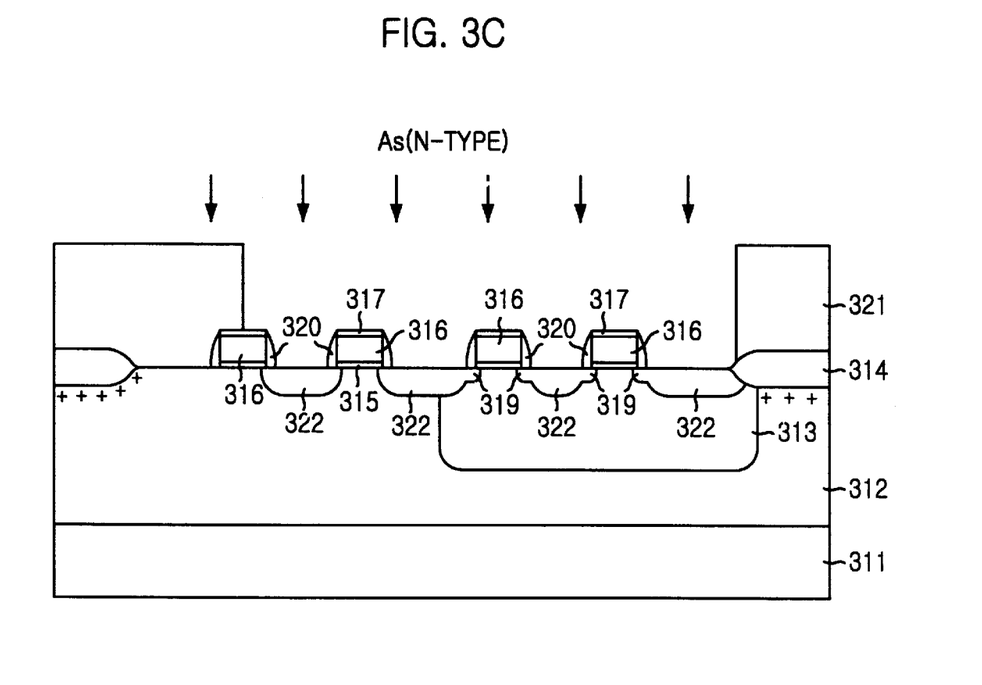

Referring to FIG. 3C, after removing the first mask pattern 318, a TEOS (Tetraethoxysilane) layer (not shown) of approximately 2,000–2,500 Å is formed on the resulting structure by the LPCVD (Low Pressure Chemical Vapor Deposition) process. Then, an anisotropical plasma etching process is applied to the TEOS layer. Accordingly, oxide layer spacers 320 are formed on sidewalls of exposed gate electrodes 316. A second mask pattern 321, which covers a portion of the transfer gate Tx and the field oxide layers 314, is formed and then, on conditions of energy of approximately 50–90 KeV and a concentration of 1E15–9E15/$cm^2$, N$^+$ diffusion regions 322, which act as source/drain electrodes, are formed by an As ion implantation. A thermal treatment is carried out in a nitrogen atmosphere at a temperature of approximately 850–950° C. for approximately 20–60 minutes. At this time, the As ions implanted into the P-epi layer 312 are laterally diffused, thereby being sufficiently diffused beneath the gate electrodes 316 of the transfer and reset gates Tx and Rx.

Figure 3D:
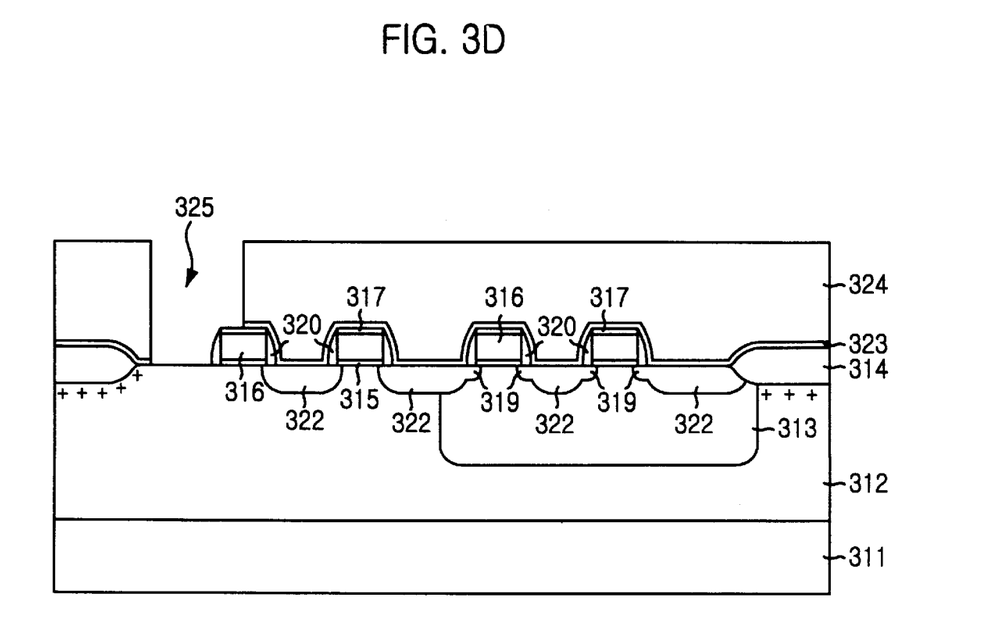

Referring to FIG. 3D, after removing the second mask pattern 321, a nitride layer 323 of approximately 100–500 Å is formed on the resulting structure by the LPCVD process and a TEOS layer 324 of approximately 8,000–10,000 Å is formed for planarization. Then, a chemical mechanical polishing (CMP) process is applied to the TEOS layer 324. The TEOS layer 324 is flatted by a slurry such as alumina ($Al_2O_3$). At this time, a polishing pressure, revolutions per minute and a polishing thickness are approximately 0.3–0.5 Kg/$m^2$, 30–40 RPM and 3,000–4,000 Å, respectively. A contact hole 325 to expose the P-epi layer 312, in which a light sensing area is positioned, is formed. The contact hole 325 should be formed on the P-epi layer 312 between the transfer gate Tx and one of the field oxide layer 314 such that a P$^0$ diffusion region is directly positioned on the P-epi layer 312 to have an equivalent potential each other.

Figure 3E:
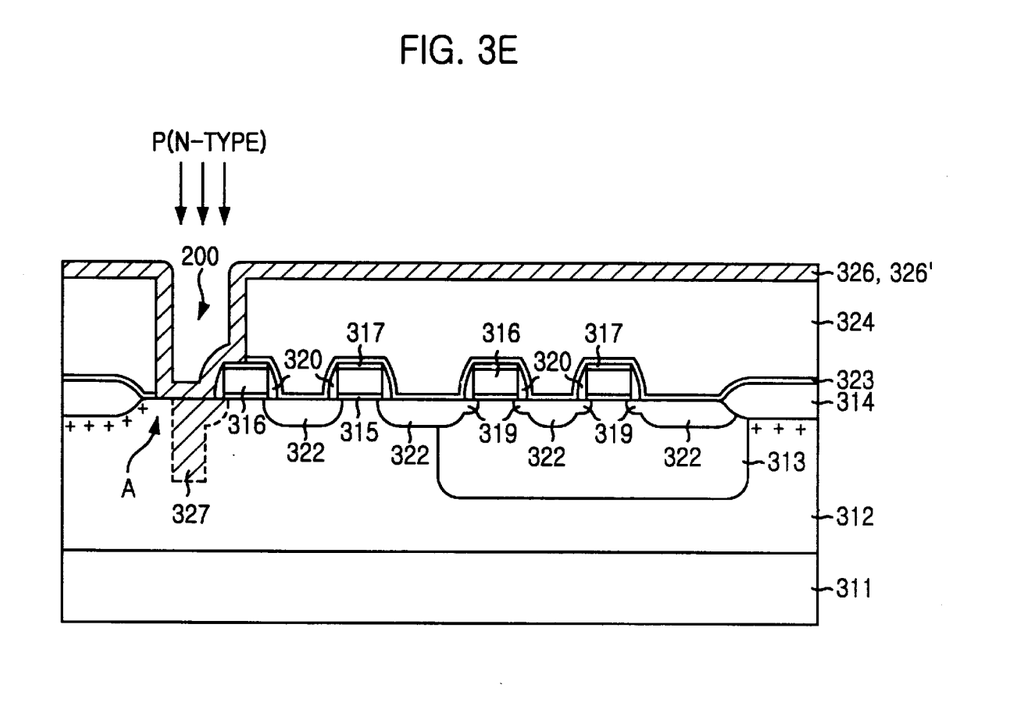

Referring to FIG. 3E, a P-epi layer 326, which has a thickness of approximately 0.7–1.5 μm, is formed on the contact hole 325, depending upon a topology of the semiconductor substrate. Then, on conditions of energy of approximately 250–500 KeV and a concentration of 1E12–3E12/$cm^2$, an N$^-$ diffusion region 327 is formed.

Phosphor ions to form the N$^-$ diffusion region 327 are also implanted into the P-epi layer 326. That is, the phosphor ion implantation is applied to the exposed P-epi layers 312 and 326 so that the P-epi layer 326 is charged into an N-type epitaxial layer (so, hereinafter the P-epi layer 326 is referred to as an N-epi layer 326'). The N-epi layer 326' is formed by various epitaxial growing methods. The impurity concentration can be controlled during the epitaxial layer growth and it is possible to provide N-type impurities for the epitaxial layer which is grown on the P-epi layer 312. On the other hand, since there exists only the N-epi layer 326' on the P-epi layer 312, the N$^-$ diffusion region 327 is deeply formed. Furthermore, it should be noted that a portion "A" of the N-epi layer 326' is directly in contact with the P-epi layer 312.

Figure 3F:
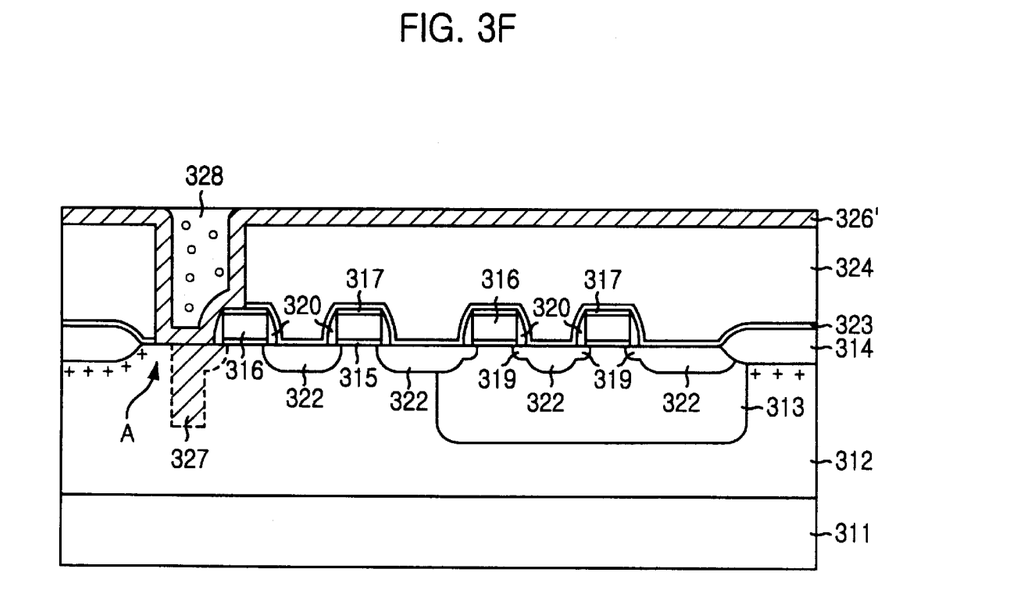

Referring to FIG. 3F, after filling in an opening portion 200 with an oxide layer 328, the oxide layer 328 outside the opening portion 200 is removed by an etch back or a CMP process.

Figure 3G:
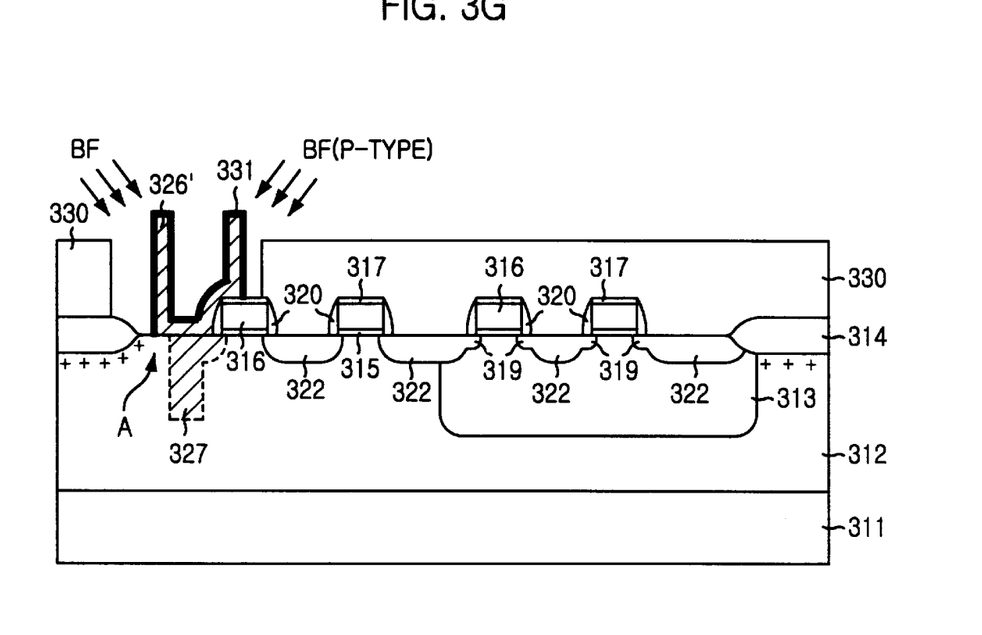

Referring to FIG. 3G, another etch back process is applied to the N-epi layer 326' such that the surface of the TEOS layer 324 is exposed. As a result, the N-epi layer 326' of a cylinder-shaped pattern is made. The TEOS and oxide layer 324 and 328 are removed by a wet etching process using an HF solution and the nitride layer 323 is removed by a phosphoric acid solution. A third mask pattern 330 is formed such that the N-epi layer 326' of the cylinder-shaped pattern is exposed. Then, on conditions of energy of approximately 20–40 KeV and a concentration of 3E12–5E12/$cm^2$, BF ions are implanted, obliquely at an angle of approximately 5–10 degrees, into the N-epi layer 326'. At this time, the P$^0$ diffusion region 331, which has a thickness of approximately 0.1 μm, is formed in the surface of the N-epi layer 326'. Since the P$^0$ diffusion region 331 is formed in the surface of the N-epi layer 326', it is also directly in contact with the P-epi layer 312 near by the channel stop region so that the P$^0$ diffusion region 331 and the P-epi layer 312 have the same potential.

Figure 3H:
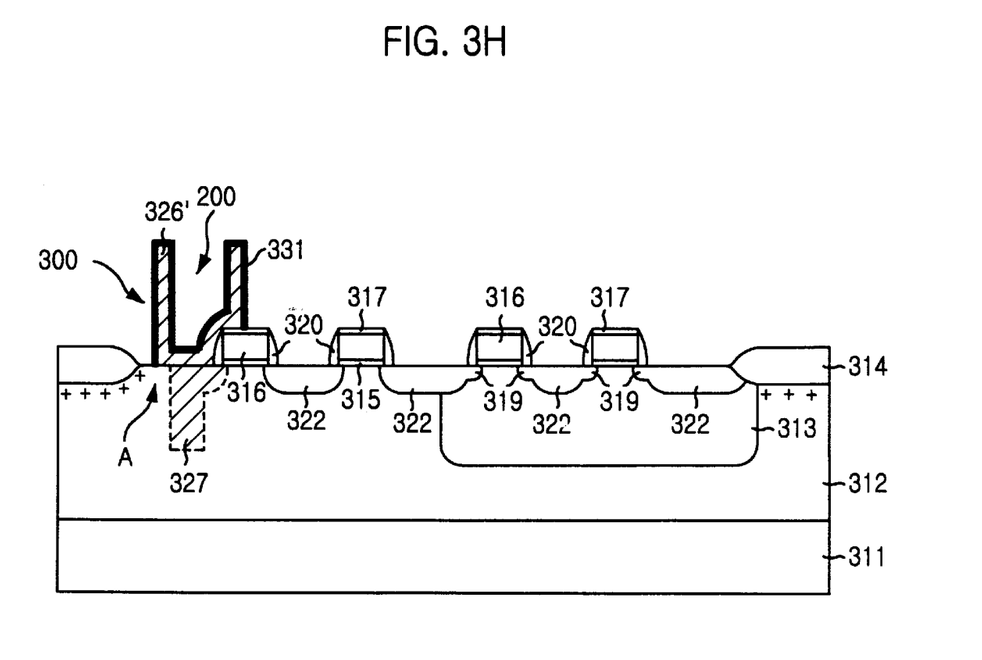

Referring to FIG. 3H, the third mask pattern 330 is removed and the final cylinder-shaped pinned photodiode 300, in which its central portion is positioned at the opening portion 200, is obtained. The cylinder-shaped pinned photodiode 300 is in contact with the P-epi layer 312 in the light sensing area and vertically extended up on the P-epi layer 312.

As shown in FIGS. 4A to 4F, a unit pixel of a CMOS image sensor according to another embodiment of the present invention has a stacked pinned photodiode to increase a unit area of a pinned photodiode with a predetermined integration degree, thereby increasing a photosensitivity.

Figure 4A:
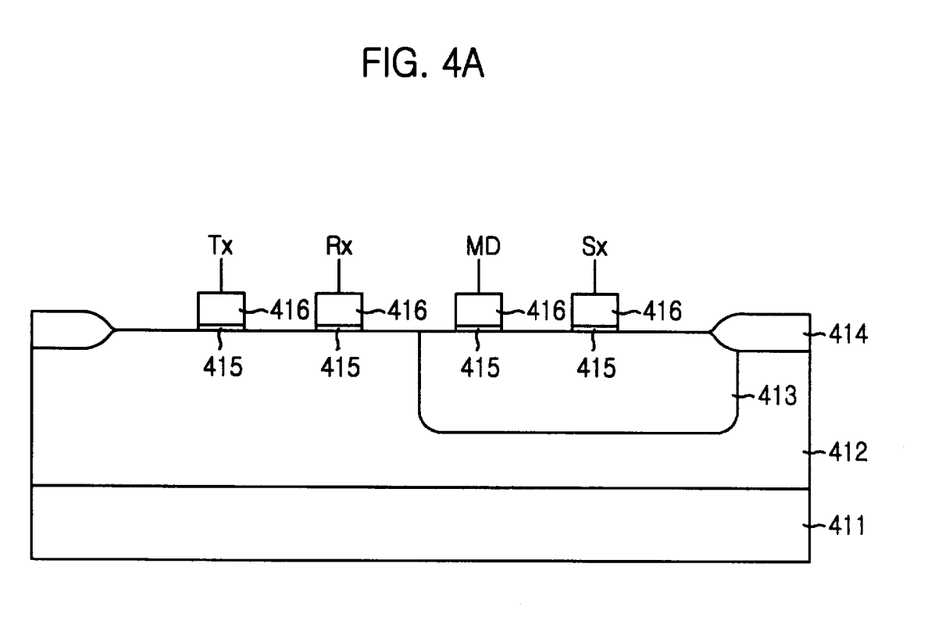
FIGS. 4A to 4F are cross-sectional views illustrating a method for fabricating a unit pixel according to another embodiment of the present invention.

Referring to FIG. 4A, on conditions of energy of approximately 50–100 KeV and a concentration of 7E12–9E12/cm$^2$, a P-well 413 is formed in a P-epi layer 412 using a boron ion implantation and the P-epi layer 412 is grown on a silicon substrate 411 as an epitaxial layer. The P-epi layer 412 has a resistance of approximately 15–25 Ωm. Then, field oxide layers 414, gate oxide layers 415 and gate electrodes 416 are in this order formed. Transfer and reset gates Tx and Rx have channel length more than approximately 1 $\mu$m. Also, drive and select gates MD and Sx have channel length less than approximately 0.5 $\mu$m.

Figure 4B:
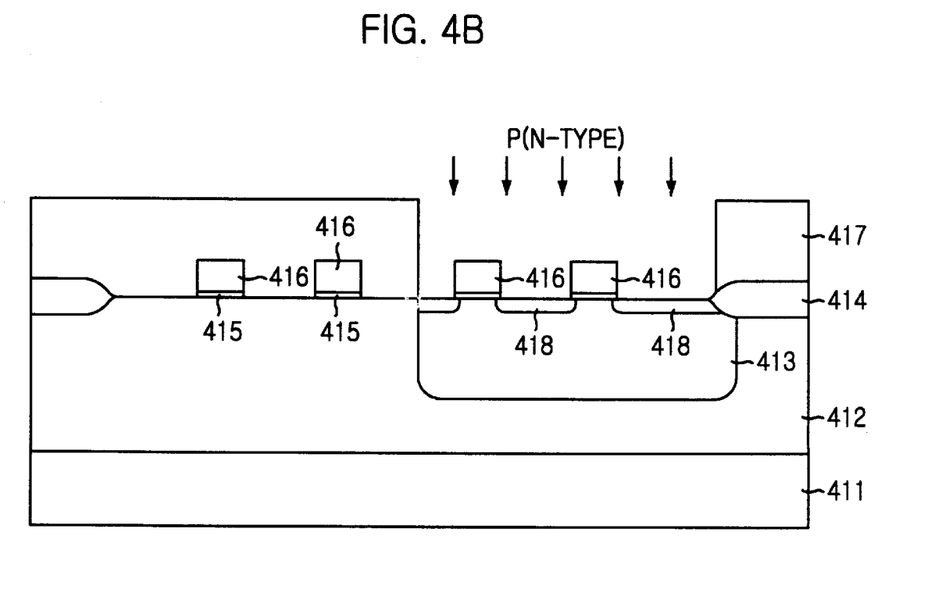

Referring to FIG. 4B, a first mask pattern 417 to open the P-well 413 is formed. Then, on conditions of energy of approximately 20–60 KeV and a concentration of 1E13–5E13/cm$^2$, lightly doped N$^-$ regions 418 for a LDD structure are formed by a phosphor ion implantation.

Figure 4C:
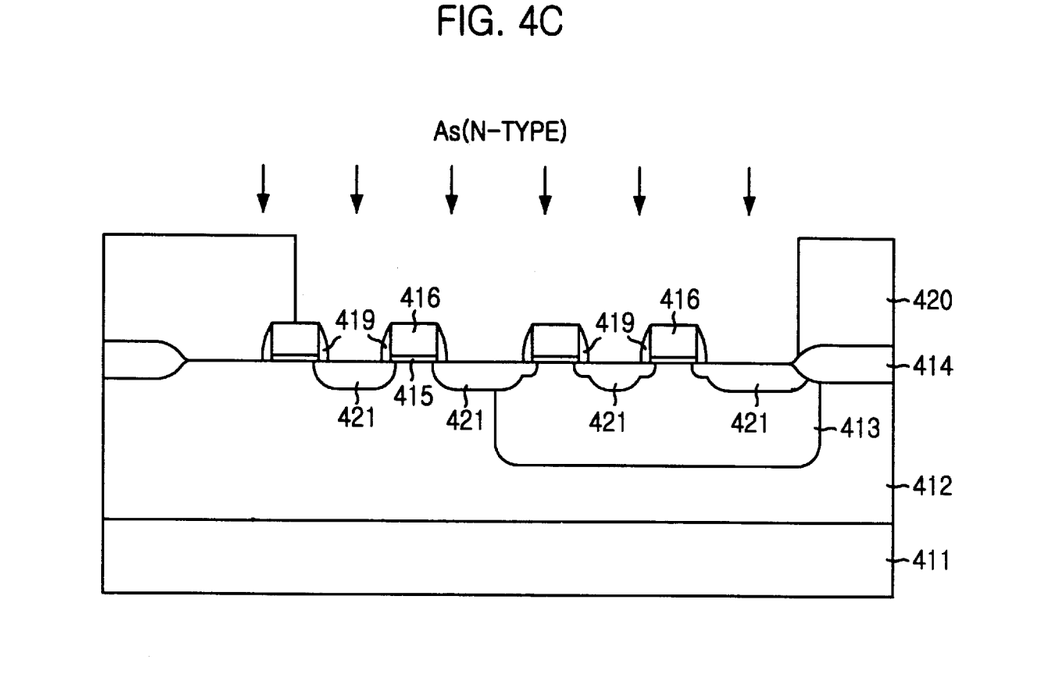

Referring to FIG. 4C, after removing the first mask pattern 417, a TEOS layer (not shown) of approximately 2,000–2,500 Å is formed on the resulting structure by a LPCVD process. Then, an anisotropical plasma etching process is applied to the TEOS layer. Accordingly, oxide layer spacers 419 are formed on sidewalls of exposed gate electrodes 316. A second mask pattern 420, which covers a portion of the transfer gate Tx and the field oxide layers 414, is formed and then, on conditions of energy of approximately 60–90 KeV and a concentration of 1E15–9E15/cm$^2$, N$^+$ diffusion regions 421, which act as source/drain electrodes, are formed by an As ion implantation.

Figure 4D:
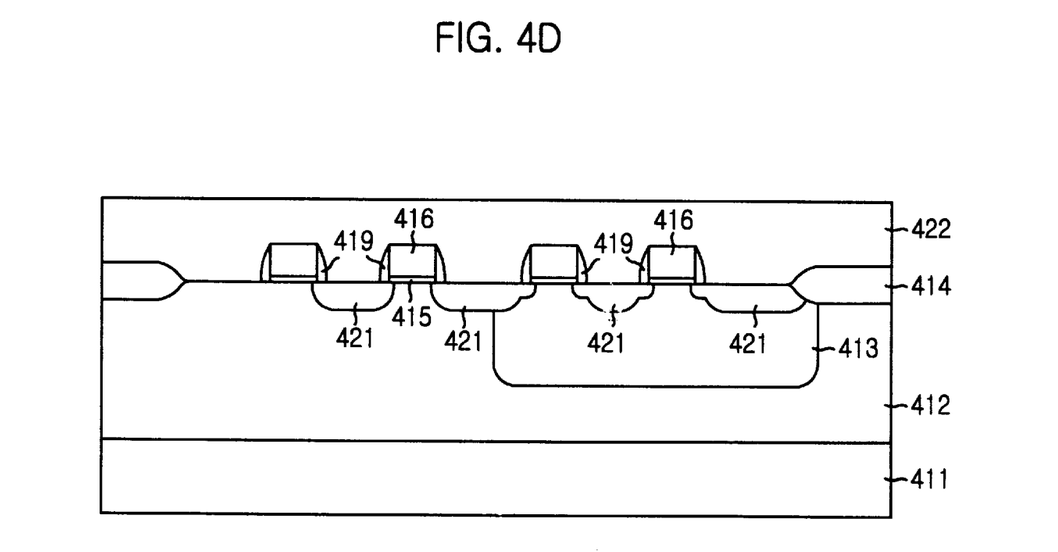

Referring to FIG. 4D, after removing the second mask pattern 420, an oxide layer 422 of approximately 8,000–10,000 Å, such as a TEOS layer, is formed. Then, a chemical mechanical polishing (CMP) process is applied to the oxide layer 422. The oxide layer 422 is flatted by a slurry, such as alumina ($Al_2O_3$). At this time, a polishing pressure, revolutions per minute and a polishing thickness are approximately 0.3–0.5 Kg/m$^2$, 30–40 RPM and 3,000–4,000 Å, respectively.

Figure 4E:
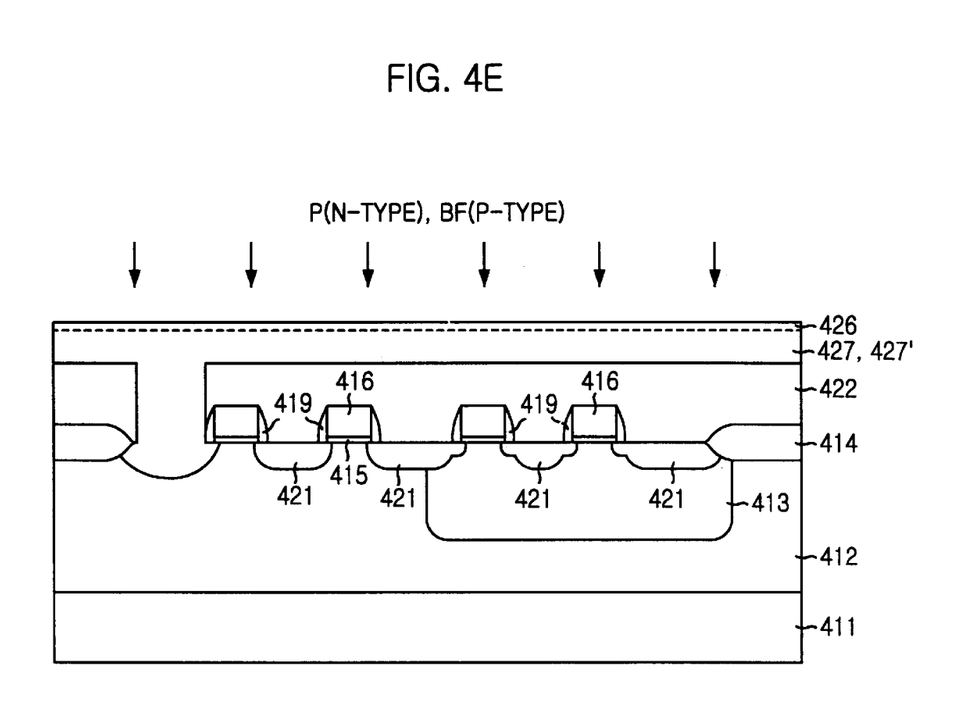

Referring to FIG. 4E, a contact hole to expose the P-epi layer 412 is formed on the P-epi layer 412 between the transfer gate Tx and one of the field oxide layers 414. After forming the contact hole, a P-epi layer 427, which has a thickness of approximately 0.5–1.5 $\mu$m, is formed. Then, on conditions of energy of approximately 250–500 KeV and a concentration of 1E12–3E12/cm$^2$, an N$^-$ diffusion region is formed in the P-epi layer 427 by a phosphor ion implantation (so, hereinafter, the P-epi layer 427 is referred to as an N-epi layer 427') and a portion of the P-epi layer 412 is in contact with the N-epi layer 427'. Also, on conditions of energy of approximately 20–40 KeV and a concentration of 3E12–5E12/cm$^2$, a P$^0$ diffusion region 426, which has a thickness of approximately 0.1 $\mu$m, is formed in a surface of the N-epi layer 427' by a BF ion implantation.

On the other hand, to form the N-epi layer 427' as described above, a polysilicon or non-crystalline silicon layer can be formed on the resulting structure. So, an energy beam of a laser or a rod-shaped heater is illuminated to the polysilicon or non-crystalline silicon layer, thereby forming a single crystal epitaxial silicon layer with a thickness of several micrometers to millimeters.

Figure 4F:
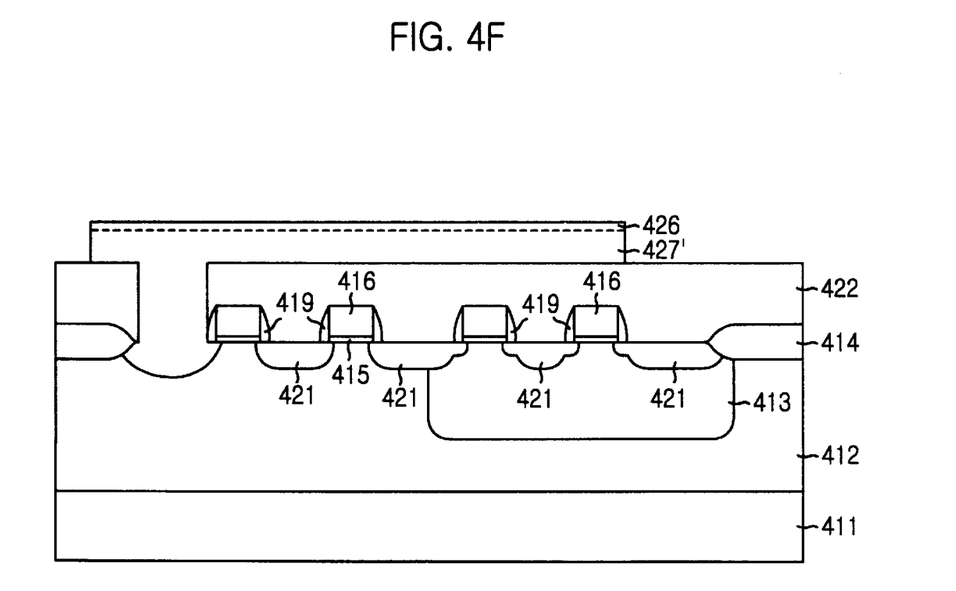

Referring to FIG. 4F, the N-epi layer 427' is patterned by a photo etching process and the final stacked pinned photodiode is obtained. The stacked pinned photodiode is in contact with the P-epi layer 412 in a light sensing area and extended horizontally on the oxide layer 422.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a CMOS image sensor, comprising, the steps of:

(a) providing a semiconductor layer of a first conductivity type;

(b) exposing a portion of the semiconductor layer, thereby defining a light sensing area in which a photodiode is formed;

(c) growing an epitaxial layer on the exposed semiconductor layer;

(d) implanting impurities of a second conductivity type into the grown epitaxial layer, thereby forming a second type diffusion layer;

(e) implanting impurities of the first conductivity type into the grown epitaxial layer so that a first type diffusion layer is formed in the second type diffusion layer, wherein a thickness of the first conductivity diffusion layer formed is thinner than that of the second type conductivity diffusion layer; and (f) patterning the grown epitaxial layer so that a surface area of the grown and patterned epitaxial layer is greater than that of the exposed semiconductor layer and a PN junction is formed along a surface of the patterned epitaxial layer.

2. The method as recited in claim 1, wherein the step (b) comprises the steps of:

forming an interlayer insulating layer on the resulting structure; and forming a contact hole exposing the light sensing area.

3. The method as recited in claim 2, wherein the epitaxial layer is grown on the light sensing area so that the contact hole is filled in with the epitaxial layer.

4. The method as recited in claim 1, wherein the step (d) further comprises the step of polishing the grown epitaxial layer.

5. The method as recited in claim 1, wherein the second type diffusion layer has a thickness of approximately 0.7 to 1.5 $\mu$m and wherein the first type diffusion layer has a thickness of approximately 0.1 $\mu$m.

6. The method of claim 1 wherein patterning the grown epitaxial layer includes applying an etch back process to the grown epitaxial layer.

7. A method for fabricating a CMOS image sensor, comprising the steps of:

(a) providing a semiconductor layer of a first conductivity type;

(b) exposing a portion of the semiconductor layer, thereby defining a light sensing area in which a photodiode is formed;

(c) growing an epitaxial layer on the exposed semiconductor layer;

(d) implanting impurities of a second conductivity type into the grown epitaxial layer, thereby forming a second type diffusion layer;

(e) patterning the grown epitaxial layer so that a surface of the grown and patterned epitaxial layer is greater than that of the exposed semiconductor layer;

(f) forming an ion implanting mask exposing the grown epitaxial layer; and (g) implanting impurities of the first conductivity type into the grown epitaxial layer so that a first type diffusion layer is formed in the second type diffusion layer, wherein a thickness of the first type diffusion layer formed is thinner than that of the second type diffusion layer and wherein the first type diffusion layer is directly in contact with the semiconductor layer so that a PN junction is formed along a surface of the patterned epitaxial layer.

8. The method as recited in claim 7, wherein the step (d) further comprises a step of implanting impurities of the second conductivity type into the semiconductor layer beneath the epitaxial layer.

9. The method as recited in claim 7, wherein the step (b) comprises the steps of:

forming an interlayer insulating layer on the resulting structure; and forming a contact hole exposing the light sensing area.

10. The method as recited in claim 9, wherein the epitaxial layer is grown on the light sensing area, sidewalls of the contact hole and the interlayer insulating layer.

11. The method as recited in claim 7, wherein the step (e) comprises the steps of:

applying an etch back process to the epitaxial layer on the interlayer insulating layer; and removing the interlayer insulating layer.

12. The method as recited in claim 7, wherein the ion implanting mask exposes top and sides of the grown epitaxial layer.

13. The method as recited in claim 11, wherein the step (g) of implanting impurities of the first conductive type into the grown epitaxial layer is carried out by an oblique ion implantation.

14. The method of claim 7 wherein patterning the grown epitaxial layer includes applying an etching process to the grown epitaxial layer.

15. The method as recited in claim 7, wherein the second type diffusion layer has a thickness of approximately 0.5 to 1.5 $\mu$m and wherein the first type diffusion layer has a thickness of approximately 0.1 $\mu$m.

16. The method as recited in claim 14, wherein the oblique ion implantation is carried out at an angle of approximately 5–10 degrees.

* * * * *